(12) United States Patent
Nagasaka et al.

(10) Patent No.: US 7,428,127 B2
(45) Date of Patent: Sep. 23, 2008

(54) CPP MAGNETORESISTIVE EFFECT ELEMENT AND MAGNETIC STORAGE DEVICE HAVING A CPP MAGNETORESISTIVE EFFECT ELEMENT

(75) Inventors: Keiichi Nagasaka, Kawasaki (JP); Yoshihiko Seyama, Kawasaki (JP); Hirotaka Oshima, Kawasaki (JP); Yutaka Shimizu, Kawasaki (JP); Atsushi Tanaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 488 days.

(21) Appl. No.: 11/042,962

(22) Filed: Jan. 25, 2005

(65) Prior Publication Data

US 2005/0152076 A1 Jul. 14, 2005

Related U.S. Application Data

(63) Continuation of application No. PCT/JP2003/016191, filed on Dec. 17, 2003.

(30) Foreign Application Priority Data

Dec. 24, 2002 (JP) .............................. 2002-372423

(51) Int. Cl.
*G11B 5/33* (2006.01)
*G11B 5/127* (2006.01)

(52) U.S. Cl. .............................. 360/324.1; 360/324.11; 360/324.12

(58) Field of Classification Search ............. 360/324.1, 360/324.11, 324.12, 324.2
See application file for complete search history.

(56) References Cited

U.S. PATENT DOCUMENTS

| | | | |
|---|---|---|---|
| 6,178,112 B1 | 1/2001 | Bessho et al. | |
| 6,205,008 B1 * | 3/2001 | Gijs et al. ................... | 360/324 |
| 6,365,286 B1 | 4/2002 | Inomata et al. | |
| 6,556,390 B1 * | 4/2003 | Mao et al. ................ | 360/324.1 |
| 6,624,985 B1 * | 9/2003 | Freitag et al. ........... | 360/324.1 |
| 6,639,765 B2 * | 10/2003 | Adachi et al. ........... | 360/324.2 |
| 6,686,068 B2 * | 2/2004 | Carey et al. ............. | 428/811.3 |
| 6,781,799 B2 * | 8/2004 | Seyama et al. ......... | 360/324.11 |
| 6,853,520 B2 * | 2/2005 | Fukuzawa et al. ....... | 360/324.1 |
| 6,950,290 B2 * | 9/2005 | Hayashi et al. .......... | 360/324.1 |
| 2002/0097538 A1 | 7/2002 | Seyama et al. | |

FOREIGN PATENT DOCUMENTS

| | | |
|---|---|---|
| EP | 0 973 169 | 1/2000 |
| EP | 1 328 027 | 7/2003 |
| JP | 10-079305 | 3/1998 |
| JP | 11-177161 | 7/1999 |
| JP | 2002-157711 | 5/2002 |
| JP | 2003204094 A  * | 7/2003 |

* cited by examiner

*Primary Examiner*—Angel Castro
*Assistant Examiner*—Christopher R. Magee
(74) *Attorney, Agent, or Firm*—Greer, Burns & Crain, Ltd.

(57) ABSTRACT

A CPP magnetoresistive effect element includes a free magnetization layer, a fixed magnetization layer, and a plurality of conductive non-magnetic intermediate layers formed between the free magnetization layer and the fixed magnetization layer. An insulating layer and a magnetic layer including magnetic atoms are provided between any two of the non-magnetic intermediate layers.

11 Claims, 12 Drawing Sheets

CPP MAGNETORESISTIVE EFFECT ELEMENT AND MAGNETIC STORAGE DEVICE HAVING A CPP MAGNETORESISTIVE EFFECT ELEMENT

CROSS-REFERENCE TO RELATED APPLICATION

This application is a U.S. continuation application, filed under 35 USC 111(a) and claiming the benefit under 35 USC 120 and 365(c), of PCT application PCT/JP2003/016191, filed Dec. 17, 2003, which claims priority to Application Ser. No. 2002-372423, filed in Japan on Dec. 24, 2002. The foregoing applications are hereby incorporated herein by reference.

BACKGROUND OF THE INVENTION

1. Field of the Invention

The present invention relates to a magnetic sensor such as a magnetoresistive effect element for reproducing information in a magnetic storage device, and more particularly, to a magnetoresistive effect element having a CPP (Current Perpendicular to Plane) structure that applies a sense current in a stacking direction of spin-valve films.

2. Description of the Related Art

With the rapid proliferation of the Internet, digital TV broadcasting and the like, needs for mass storage devices are rapidly increasing. In mass storage devices such as hard disk devices, recording density is significantly improved. Particularly, since the middle of 1990s, the recording density has been improved at 60-100% annual rates. The key technical progress areas during the above-mentioned period include an increase in coercive force and reduction of medium noise in magnetic disks and, as for magnetic heads, the development of spin-valve GMR heads as magnetic heads for reproduction.

A conventional spin-valve GMR head includes a CIP (Current In-Plane) structure, that is, a sense current is applied in a direction within a film surface of a spin-valve film, electrons are scatted in accordance with the relative angle of magnetization between a fixed magnetization layer and a free magnetization layer forming the spin-valve film, and the resistance value of the spin-valve film varies. Currently, a rate of resistance change of 15% and a recording density of approximately 50 Gbit/in$^2$ have been achieved.

In order to achieve a recording density in the 100 Gbit/in$^2$ range of the next generation, TMR (Tunnel Magneto Resistance Effect) heads and CPP (Current Perpendicular to Plane)-GMR heads have been studied. Although TMR heads include a high rate of resistance change, there is a disadvantage in that a resistance value RA is several $\Omega$ $\mu m^2$, which is a high value. On the other hand, CPP-GMR heads include features such that the resistance value RA is 1 $\Omega$ $\mu m^2$ or less, which is a moderate resistance value RA, and as the element size is reduced, the rate of resistance change is increased and the device output is increased. Thus, CPP-GMR heads are expected to serve as sensitive reproducing heads in high-density recording apparatuses.

However, CPP-GMR heads have a problem in that the rate of resistance change is low and the sensitivity of a magnetoresistive effect element is insufficient for achieving a recording density of 100 Gbit/in$^2$ range.

For example, there is an approach of miniaturizing the element size in order to improve sensitivity. However, even if photolithography techniques are used, the element size is limited to about 100 nm×100 nm, and further significant miniaturization cannot be expected. Hence, it is impossible to improve the sensitivity of magnetoresistive effect elements.

SUMMARY OF THE INVENTION

A general object of the present invention is to provide a novel and useful CPP magnetoresistive effect element, manufacturing method thereof, and magnetic storage device having such a CPP magnetoresistive effect element in which the above-mentioned problems are eliminated.

A more specific object of the present invention is to provide a CPP magnetoresistive effect element having a high rate of resistance change and a high sensitivity and being suitable for high-density recording, a manufacturing method thereof, and a magnetic storage device having such a CPP magnetoresistive effect element.

According to one aspect of the present invention, there is provided a CPP magnetoresistive effect element including a free magnetization layer, a fixed magnetization layer, and a plurality of conductive non-magnetic intermediate layers formed between the free magnetization layer and the fixed magnetization layer, wherein an insulating layer and a magnetic layer including magnetic atoms are provided between any two of the non-magnetic intermediate layers.

According the present invention, plural conductive non-magnetic intermediate layers are formed between the free magnetization layer and the fixed magnetization layer, and the insulating layer and the magnetic layer including magnetic atoms are interposed between the conductive non-magnetic intermediate layers. In the insulating layer, electrons flowing through a CPP magnetoresistive effect element as a sense current are locally concentrated in a portion where electrons can easily flow, due to minute nonuniformity of, for example, the property of the insulating layer. Thus, pathways of the electrons are confined. The confined electrons reach the free magnetization layer or the fixed magnetization layer. Thus, the rate of resistance change is increased as the resistance value is increased in the vicinity of the portion where the confined electrons reach the free magnetization layer or the fixed magnetization layer. Consequently, the rate of resistance change is improved in the element as a whole. In addition, it is considered that scattering occurs in the magnetic/non-magnetic interface between the magnetic layer and the non-magnetic intermediate layer. Thus, the rate of resistance change is further increased. Particularly, it is considered that a synergetic effect of the confining effect of electrons and the scattering effect in the interface occurs. Thus, the rate of resistance change is further improved, and it is possible to improve the sensitivity for detecting a magnetic field.

The insulating layer and the magnetic layer may contact each other, and the insulating layer may be made of an oxide of a material forming the magnetic layer. By performing, for example, an oxidation process on a surface of the magnetic layer, it is possible to oxidize the material forming the magnetic layer and readily form the insulating layer. Particularly, since the insulating layer and the magnetic layer are formed close to each other, it is considered that the above-mentioned current confining effect and interface scattering effect are increased in a synergetic manner. Hence, it is possible to further improve the rate of resistance change.

The magnetic layer may be formed by plural layers, and the insulting layer may be interposed between the plural magnetic layers. Thus, it is possible to form more magnetic/non-magnetic interfaces with a lesser number of layers.

Hence, it is possible to further improve the rate of resistance change with a lesser number of layers.

At least one of the free magnetization layer and the fixed magnetization layer may include a structure (hereinafter referred to as "stacked ferromagnetic structure") in which two ferromagnetic layers are coupled (stacked) in an antiferromagnetic manner.

The magnetic layer may be formed by a ferromagnetic layer, and the magnetic atoms may include at least one of Fe, Co and Ni. Thus, it is possible to increase an interface scattering effect in a magnetic/non-magnetic interface, and further improve the rate of resistance change.

According to another aspect of the present invention, there is provided a magnetic storage device including a magnetic recording medium and the CPP magnetoresistive effect element as mentioned above.

According to the present invention, since a CPP magnetoresistive effect element having a high rate of resistance change and high sensitivity is provided, it becomes possible to perform high-density recording on a magnetic recording medium.

According to another aspect of the present invention, there is provided a manufacturing method of a CPP magnetoresistive effect element including a free magnetization layer, a fixed magnetization layer, a plurality of conductive non-magnetic intermediate layers interposed between the free magnetization layer and the fixed magnetization layer, an insulating layer and a magnetic layer including magnetic atoms, the insulating layer and the magnetic layer being interposed between the non-magnetic intermediate layers, the manufacturing method including the step of:

forming the insulating layer by performing an oxidation process on the magnetic layer.

According to the present invention, it is possible to readily form an insulating layer by performing an oxidation process on a magnetic layer, and improve the rate of resistance change by a current confining effect of the insulating layer and a scattering effect in the interface between the magnetic layer and a non-magnetic intermediate layer. Particularly, since the insulating layer and the magnetic layer are formed close to each other, and the above-mentioned current confining effect and interface scattering effect take place in close proximity to each other, theses effects are increased in a synergistic manner. Hence, it is possible to further improve the rate of resistance change.

The inventors of the present invention have found that, by interposing a magnetic layer including an insulating layer and magnetic atoms between a free magnetization layer and a fixed magnetization layer via a conductive nonmagnetic intermediate layer, a high rate of resistance change that has not previously been achieved is obtained in a CPP magnetoresistive effect element.

FIG. 1 is an imaginary diagram schematically showing the pathways of electrons flowing in a GMR film of the present invention. Referring to FIG. 1, a sense current (electron) flows in a stacking direction of a GMR film 100. Here, a description is given with the assumption that electrons flow from a free magnetization layer 101 to a fixed magnetization layer 102. First, electrons that pass the free magnetization layer 101 obtain information of the direction of magnetization of the free magnetization layer 101 by interaction with magnetization of the free magnetization layer 101, flow through a Cu layer, which is an upper non-magnetic intermediate layer 103, and reach an insulating layer 104. In the insulating layer 104, electrons are concentrated in a portion 104-1 (for example, a portion having relatively good conductivity due to a microscopic loss of oxygen atoms) through which portion electrons can easily pass, and a portion where the spatial density of electrons is increased is formed. Further, surface scattering is caused in an interface BD between a magnetic layer 105 and a lower non-magnetic layer 106. Then, the electrons reach the fixed magnetization layer 102 with the spatial density of electrons being high, the electrons are scattered in accordance with the direction of magnetization of the fixed magnetization layer 102, and the amount of electrons that pass the GMR film is defined. It is contemplated that the rate of resistance change is increased in the present invention by a synergistic effect of a current confining effect and surface scattering in the interface between the magnetic/non-magnetic layers.

Other objects, features and advantages of the present invention will become more apparent from the following detailed description when read in conjunction with the following drawings.

DETAILED DESCRIPTION OF THE PREFERRED EMBODIMENTS

A description is given below of embodiments of the present invention with reference to the drawings.

First Embodiment

Figure 1:
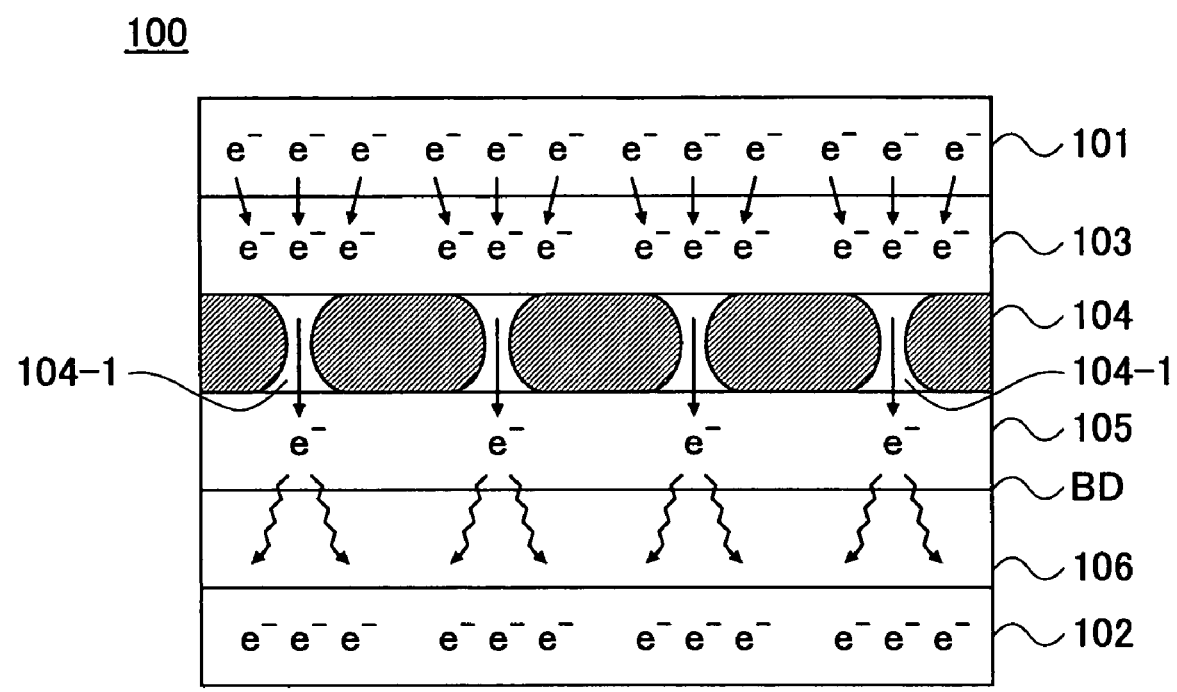
FIG. 1 is a diagram schematically showing pathways of electrons flowing through a GMR film according to the present invention.
Figure 2A:
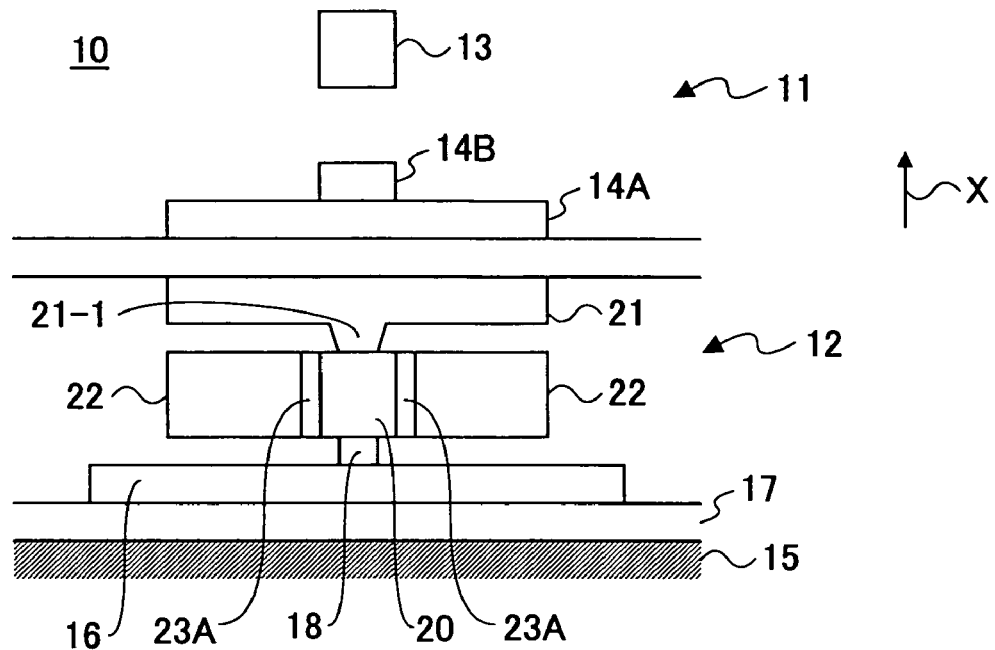
FIG. 2A is a diagram showing the structure of a medium facing surface of a compound type magnetic head.

FIG. 2A is a diagram showing the structure of a medium facing surface of an element of a compound type magnetic head 10, which element performs writing and reading. In FIG. 2A, the rotational direction of the medium is the direction indicated by an arrow X.

Referring to FIG. 2A, the compound type magnetic head 10 includes: a guiding type writing element 11 that is positioned on the downstream side of the rotational direction of the medium and performs writing; and a magnetoresistive effect element 12 that is positioned on the upstream side and includes a CPP structure. In the compound type magnetic head 10, the guiding type writing element records information on a magnetic recording medium (not shown), which faces the element, by a magnetic field that emanates between an upper magnetic pole 13 and a lower magnetic pole 14. In addition, based on the information recorded on the magnetic recording medium, the magnetoresistive effect element 12 detects the emanating magnetic field as a resistance change.

The guiding type writing element 11 and the magnetoresistive effect element 12 are formed by being stacked on a planar ceramic substrate 15 made of $Al_2O_3$—TiC (AlTiC), which forms a base substance of a head slider, and are covered by an insulating body such as alumina.

The guiding type writing element 11 includes the upper magnetic pole 13 having, in a medium facing surface, a width corresponding to the track width of the magnetic recording medium, the lower magnetic pole 14 facing the magnetic recording medium with a writing gap layer being interposed therebetween, a yoke (not shown) connecting the upper magnetic pole and the lower magnetic pole, and a coil (not shown) wound around the yoke. The upper magnetic pole 13, the lower magnetic pole 14, and the yoke are formed by a soft magnetic material. In order to secure a recording magnetic field, a material having a high saturation flux density, such as $Ni_{80}Fe_{20}$, CoZrNb, FeN, FeSiN, FeCo alloy, is preferred.

The magnetoresistive effect element 12 includes a lower electrode 16, a lower sub-electrode 18, a GMR film 20, an upper electrode 21, and magnetic domain control films 22, which are formed on a surface of the insulating layer on the lower electrode 16. An insulating film 23A is provided between the GMR film 20 and each of the magnetic domain control films 22. A sense current for detecting a resistance change is applied from the lower electrode 16 or the upper electrode 21, the sense current is concentrated in the vicinity of the middle of the GMR film 20 by the lower sub-electrode 18 connected to the lower electrode 16 or a terminal portion 21-1 of the upper electrode 21 connected to the GMR film 20, and the sense current is applied in the stacking direction of the GMR film 20. If the sense current is concentrated in the vicinity of the middle of the GMR film 20, it is possible to improve the rate of resistance change. Magnetic domain control films 22 are arranged on both sides of the GMR film 20 with gaps by the insulating layer 23A. The magnetic domain control films 22 prevent occurrence of Barkhausen noise by making a free magnetization layer (shown in FIG. 3), which is a soft magnetic layer constituting the GMR film 20, to be a single magnetic domain. It should be noted that, since the lower electrode 16, the lower sub-electrode 18, and the upper electrode 21 also function as a magnetic shield as well as pathways of the sense current, the lower electrode 16, the lower sub-electrode 18, and the upper electrode 21 are made of a soft magnetic alloy such as NiFe (Permalloy).

Figure 2B:
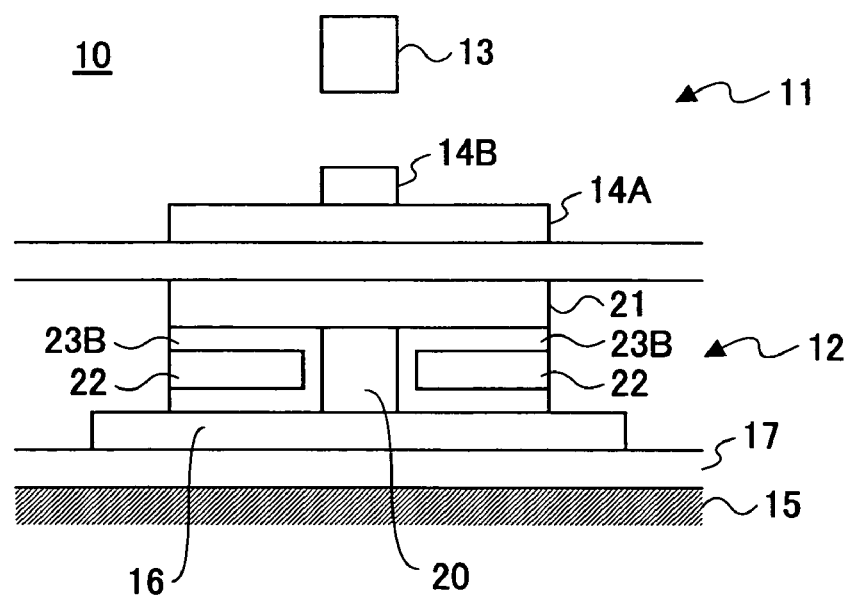
FIG. 2B is a diagram showing the structure of a medium facing surface of another compound type magnetic head.

FIG. 2A shows the case where the magnetoresistive effect element 12 includes the lower sub-electrode 18 and the terminal portion 21-1. However, as shown in FIG. 2B, the magnetoresistive effect element 12 may be formed without the lower sub-electrode 18 and the terminal portion 21-1. In this case, an insulator 23B is provided between the GMR film 20 and the magnetic domain control film 22 and between the upper electrode 21 and the magnetic domain control film 22. In addition, the contact area between the upper electrode 21 and the GMR film 20 is substantially the same as the cross-sectional area of the GMR film 20. Further, the contact area between the lower electrode 16 and the GMR film 20 is substantially the same as the cross-sectional area of the GMR film 20.

Figure 3:
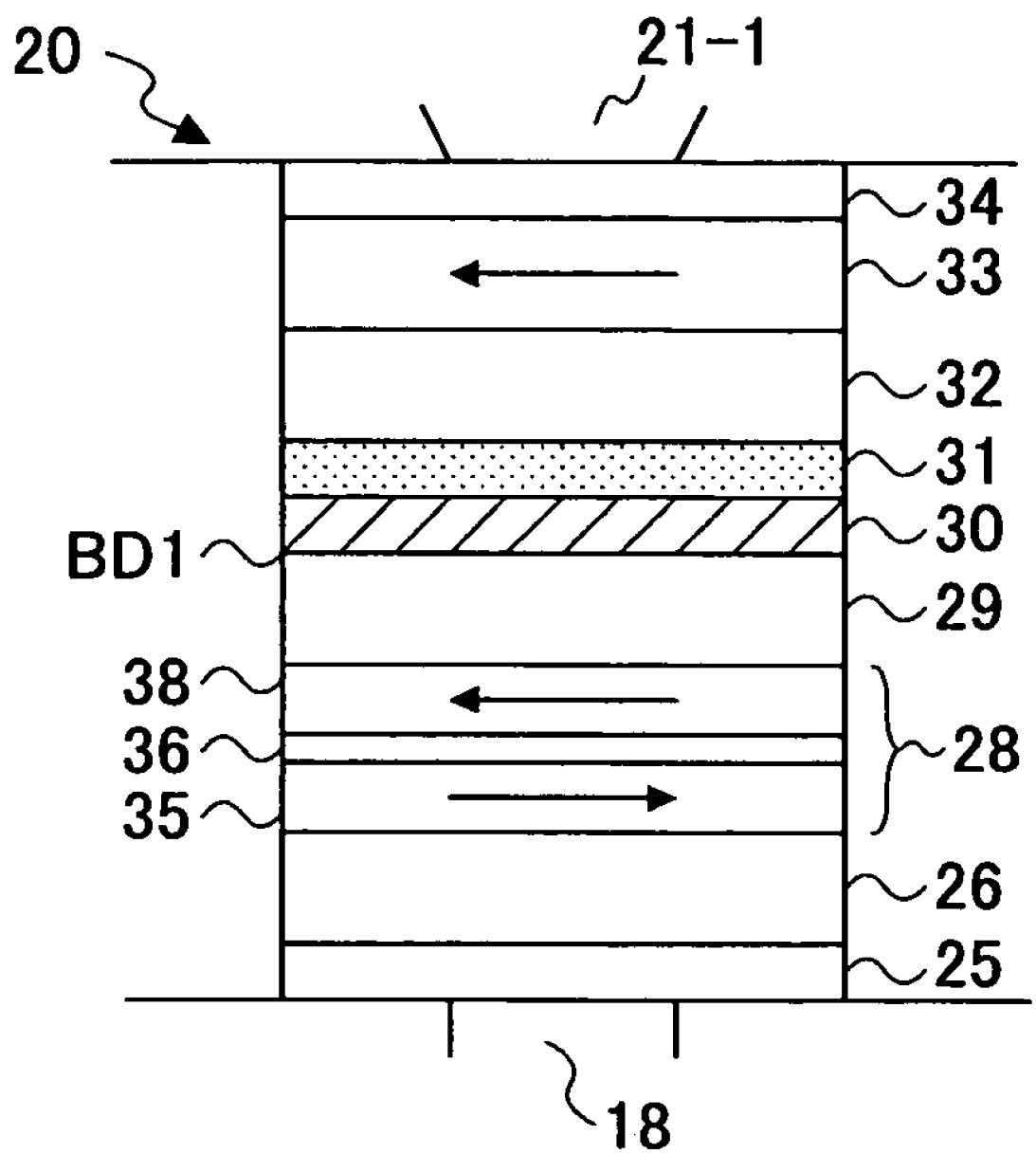
FIG. 3 is a diagram showing the structure of a GMR film according to a first embodiment of the present invention.

FIG. 3 is a diagram showing a GMR film according to an embodiment of the present invention. Referring to FIG. 3, the GMR film 20 according to this embodiment includes a single spin-valve structure in which a base layer 25, an antiferromagnetic layer 26, a fixed magnetization layer 28, a lower non-magnetic intermediate layer 29, a magnetic intermediate layer 30, an oxide insulating layer 31, an upper non-magnetic intermediate layer 32, a free magnetization layer 33, and a protection layer 34 are sequentially stacked.

The base layer 25 is formed by, for example, sputtering, on the lower sub-electrode 18 shown in FIG. 2A. The base layer 25 is constituted by, for example, a Ta layer having a thickness of 5 nm and a NiFe layer having a thickness of 2 nm. The base layer 25 accelerates crystal growth of the antiferromagnetic layer 26 formed on a surface thereof and renders ordering of an alloy to be performed easily.

The antiferromagnetic layer 26 is formed by, for example, sputtering, on a surface of the base layer 25. The antiferromagnetic layer 26 is constituted by, for example, a PdPtMn layer having a thickness of 13 nm. Specifically, the antiferromagnetic layer 26 is constituted by an antiferromagnetic material having a thickness of 5-30 nm and including Mn and at least one element selected from a group consisting of Re, Ru, Rh, Pd, Ir, Pt, Cr, Fe, Ni, Cu, Ag and Au. Preferably, the content of Mn is 45-95 atomic %. By performing a heating process in a predetermined magnetic field immediately after formation of the antiferromagnetic layer 26, the antiferromagnetic layer 26 assumes an ordered alloy and exchange interaction appears between the stacked magnetic layers. The antiferromagnetic layer 26 fixes magnetization of the fixed magnetization layer 28 by a unidirectional anisotropic magnetic field formed by the exchange interaction.

The fixed magnetization layer 28 includes a stacked ferromagnetic structure in which a lower ferromagnetic layer 35, a non-magnetic layer 36, and an upper ferromagnetic layer 38 are sequentially stacked. Specifically, the magnetic material of the lower and upper ferromagnetic layers having a thickness of 1-5 nm is including Co, Fe, Ni, or a combination of these basically. Alternatively, films made of such materials may be stacked. The thickness of the non-magnetic layer 36 is selected from, for example the range of 0.4-2 nm such that the lower and upper ferromagnetic films 35 and 38 are coupled in an antiferromagnetic manner. The non-magnetic layer 36 is made of, for example, Ru, Cr, Ru alloy or Cr alloy. With such a structure, the direction of magnetization of the lower ferromagnetic film 35 is fixed by using unidirectional anisotropy of the antiferromagnetic layer 26 provided under the lower ferromagnetic film 35, and the lower ferromagnetic film 35 is coupled to the upper ferromagnetic film 38 in an antiferromagnetic manner. Hence, magnetization of the upper ferromagnetic film 38 is fixed to be antiparallel to magnetization of the lower ferromagnetic film 35. The fixed magnetization layer 28 may be, for example, $Co_{90}Fe_{10}$ (2 nm)/Ru (0.8 nm)/$Co_{90}Fe_{10}$ (3 nm).

The lower and upper non-magnetic intermediate layers 29 and 32 are formed by a pair of Cu layers by interposing the magnetic intermediate layer 30 described below and the oxide insulating layer 31 therebetween. Specifically, the lower and upper non-magnetic intermediate layers 29 and 32 are formed by Cu layers, each having a thickness of 2 nm, formed by sputtering.

The magnetic intermediate layer 30 is formed on the non-magnetic intermediate layer 29 by, for example, sputtering, and is constituted by, for example, CoFeB having a thickness of 1 nm. It is contemplated that the magnetic intermediate layer 30 forms a magnetic/non-magnetic interface BD1 with the lower non-magnetic intermediate layer 29, and the rate of resistance change is improved. Since the oxide insulating layer 31, which is formed on a surface of the magnetic intermediate layer 30, includes a function of current confining effect, it is possible to further improve the rate of resistance change (a detailed description thereof is given below).

The oxide insulating layer 31 is constituted by an insulating material having a thickness of approximately 1 nm and being oxidized by performing an oxidation process, which is described below, on a surface of the magnetic intermediate layer 30. As mentioned above, since the oxide insulating layer 31 includes the current confining effect, it is possible to further improve the rate of resistance change.

The free magnetization layer 33 is formed by, for example, a sputtering method on a surface of the oxide insulating layer 31, and is constituted by, for example, a CoFeB layer having a thickness of 5 nm. Specifically, the free magnetization layer 33 is constituted by, for example, a soft ferromagnetic material having a thickness of 1-10 nm and including Co, Fe, Ni, or a combination of these, such as $Ni_{80}Fe_{20}$, $Co_{90}Fe_{10}$, and $CO_{78}Fe_{20}B_2$, or by stacking such films. The direction of magnetization of the free magnetization layer 33 varies in accordance with the direction of a magnetic field within the film surface and emanating from the magnetic recording medium. As a result, the resistance value of the GMR film 20 varies in accordance with the angle formed by magnetization of the free magnetization layer 33 and magnetization of fixed magnetization layer 38.

The protection layer 34 is formed by, for example, sputtering on a surface of the free magnetization layer 33, and includes a structure in which a Cu layer having a thickness of 4 nm and a Ru layer having a thickness of 5 nm are sequentially stacked. Specifically, in the protection layer 34, the thickness of the Cu layer is 1-5 nm. The Cu layer prevents oxidation of the free magnetization layer 33 at the time of heat treating of the GMR film 20 and also improves the rate of resistance change by forming a magnetic/non-magnetic interface with the free magnetization layer 33. In addition, the thickness of the Ru layer is 5-30 nm. The Ru layer may be a non-magnetic metal such as Au, Al or W. It is possible to prevent oxidation of the GMR film 20 at the time of heat treating of the ferromagnetic layer. In the aforementioned manner, the GMR film 20 is formed.

A detailed description is given below of the magnetic intermediate layer 30 and the oxide insulating layer 31. Either of a soft magnetic material and a hard magnetic material may be used for the magnetic intermediate layer 30. A material including a 4d magnetic element and a rare earth magnetic element is used for the magnetic intermediate layer 30. Particularly, a ferromagnetic material including Fe or Co is more preferred, and a soft magnetic material such as CoFe, CoFe alloy including CoFe such as CoFeB as its main component, NiFe, NiFe alloy, and FeSiAl is especially preferred. In the case of CoFe, a material having the range of X=10-50 atomic %, where $Co_{100-x}Fe_x$ is especially preferred.

In addition, preferably, the thickness of the magnetic intermediate layer 30 is 0.5-2 nm. However, even if the thickness is 0.5 nm or less, if there is the oxide insulating layer 31 contacting the magnetic intermediate layer 30, an observed increase in the rate of resistance change is higher than that in the evaluation result of the rate of resistance change shown in FIG. 8 described below, and the amount of the increase is about 0.7%. When the thickness is 2 nm or more, the total thickness of the GMR film 20 becomes excessively large, which results in a large read gap length defined by the lower electrode 16 and the upper electrode 21.

The oxide insulating layer 31 is formed by performing, for example, radical oxidation, plasma oxidation, or natural oxidation, on a surface of the magnetic intermediate layer 30. For example, in plasma oxidation, oxygen is converted into an ionic or atomic state (radical) by introducing oxygen in a process chamber and exciting plasma, oxygen ions and atomic oxygen O* enter/react to a surface of a magnetic intermediate layer, and convert the surface of the magnetic intermediate layer to an oxide film. Oxygen ions are accelerated and collide with a surface of the magnetic intermediate layer 30, and thus offer good reactivity. Thus, oxygen ions are preferable in that it is possible to reduce oxidation time. However, when excessive accelerating energy is exerted on oxygen ions, the magnetic intermediate layer 30 may be damaged, which may lead to degradation of the surface property and/or crystallinity of a surface of the magnetic intermediate layer 30 and may further lead to formation of a pin hole or the like.

On the other hand, in radical nitridation, reaction is made with the magnetic intermediate layer 30 only by atomic oxygen O* and without acceleration. Hence, the magnetic intermediate layer 30 is not damaged when atomic oxygen O* contacts thereto. Accordingly radical nitridation is preferable in that it is possible to perform conversion into the oxide insulating layer 31 without damaging crystallinity. However, since the oxygen speed is high, controllability of processing time is low.

Natural oxidation is preferable in terms of controllability of processing time and uniformity of an oxide insulating layer to be formed. For example, after forming the magnetic intermediate layer 30 by sputtering, the magnetic intermediate layer 30 may be moved from a deposition chamber to an oxidation chamber in a high vacuum state, and processing is performed for a processing time of 50-1000 seconds by introducing an oxygen gas and setting the pressure to 1 Pa-100 kPa. With this oxidation, a surface of the magnetic intermediate layer 30 is oxidized, and the non-magnetic oxide insulating layer 31 is formed. The oxide insulating layer 31 has an effect of confining electrons flowing in the GMR film 20. That is, the oxide insulating layer 31 includes a portion where electrons can easily flow and a portion where it is difficult for electrons to flow. Thus, electrons are concentrated in the portion where electrons can easily flow. It is conceivable that, when the flow of electrons is concentrated, for example, those electrons flowing from the free magnetization layer 33 are locally confined by the oxide insulating layer 31, and even if such electrons reach the fixed magnetization layer 28, the electrons are not dispersed, but are in a state where the spatial electron density is locally high. It is considered that the ratio of performing interaction with magnetization (spin) of the fixed magnetization layer 28 is increased, and consequently, the MR ratio is increased.

Further, according to this embodiment, since the magnetic/non-magnetic interface BD1 between the magnetic intermediate layer 30 and the lower non-magnetic intermediate layer 29 is formed in the vicinity of the oxide insulating layer 31, it is considered that an interface scattering effect of electrons is effectively brought. Thus, it is possible to further improve the rate of resistance change.

Next, a description is given of a manufacturing method of a CPP magnetoresistive effect element according to this embodiment.

FIGS. 4A through 6B are diagrams showing manufacturing processes of a CPP magnetoresistive effect-element according to this embodiment. The CPP magnetoresistive effect element is manufactured in a manner almost similar to the pre-process of a semiconductor integrated device.

Figure 4A:
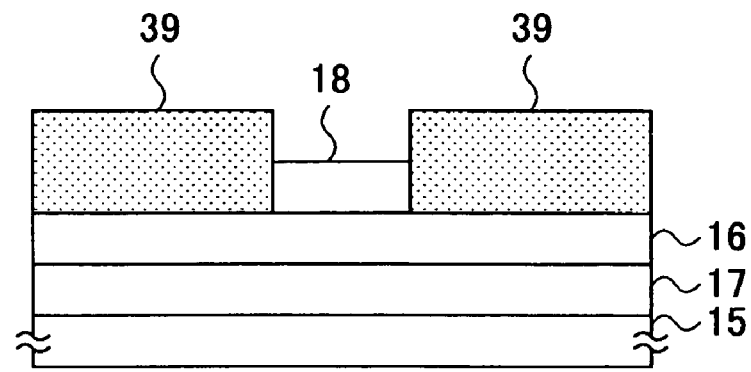
FIGS. 4A, 4B and 4C are diagrams showing manufacturing processes of a CPP magnetoresistive effect element according to the first embodiment of the present invention.

In the process of FIG. 4A, an alumina film 17 is formed on an AlTiC ceramic substrate 15, and the lower electrode 16 made of $Ni_{80}Fe_{20}$ is subsequently formed by, for example, sputtering or plating.

Further, in the process of FIG. 4A, patterning is performed on the lower electrode 16 with a resist 39, and a pattern of the lower sub-electrode 18 is formed. It is preferable that the lower-sub electrode 18 made of $Ni_{80}Fe_{20}$ is subsequently formed by, for example, plating.

Figure 4B:
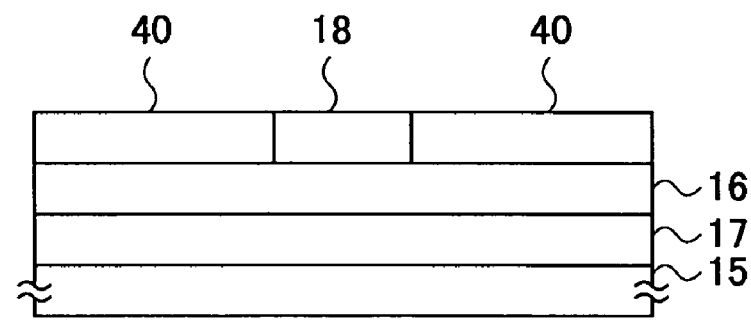

Next, in the process of FIG. 4B, the resist is removed, and an alumina film 40 is deposited by, for example, a CVD method such that the structure of FIG. 4A without a resist 39 is covered. Then, polishing is performed by a CMP (Chemical Mechanical Polishing) until the lower sub-electrode 18 is exposed, thereby obtaining a planar surface.

Figure 4C:
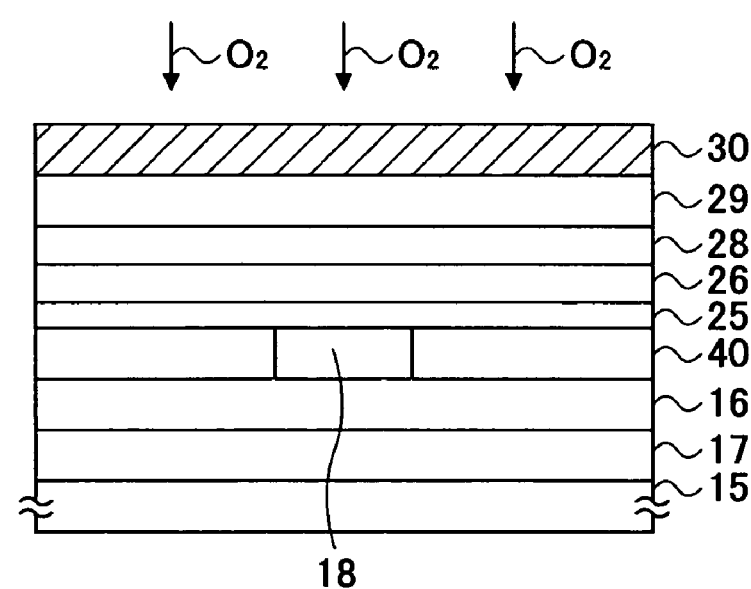

Next, in the process of FIG. 4C, the base layer 25 through the magnetic intermediate layer 30 of the GMR film 20 are formed such that the entire structure of FIG. 4B is covered. Specifically, the base layer 25 through the magnetic intermediate layer 30 made of the above-mentioned materials are formed by sputtering in a ultra-high vacuum deposition chamber capable of making a base pressure to be a vacuum higher than $1\times10^{-8}$ Pa. Then, the substrate is conveyed to an oxidization chamber without being exposed to air. It is possible to prevent adhesion of particles or organic matter on a surface of the magnetic intermediate layer 30, suppress variations in the resistance values of devices or lots, and ensure long-term operational reliability of the magnetoresistive effect element 12.

Figure 5A:
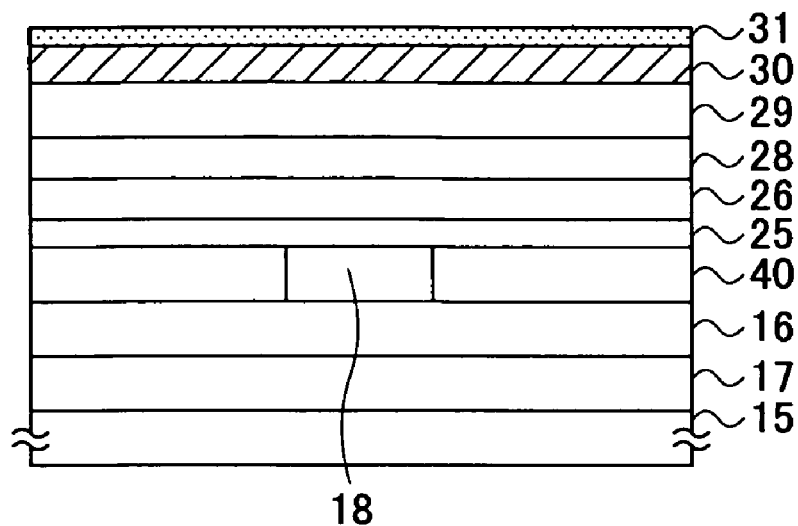
FIGS. 5A and 5B are diagrams showing manufacturing processes of the CPP magnetoresistive effect element according to the first embodiment of the present invention.

Further, in the process of FIG. 4C, an oxidation process of the magnetic intermediate layer 30 is performed by natural oxidation. Specifically, the substrate is maintained at room temperature, an oxygen gas is introduced into the oxidation chamber, and the pressure is set to 1 Pa-100 kPa. The magnetic intermediate layer 30 is exposed to oxygen gas for a processing time of 50-1000 seconds. Thereby, as shown in FIG. 5, the oxide insulating layer 31, which is obtained by oxidizing the magnetic intermediate layer 30, is formed on the surface of the magnetic intermediate layer 30.

Figure 5B:
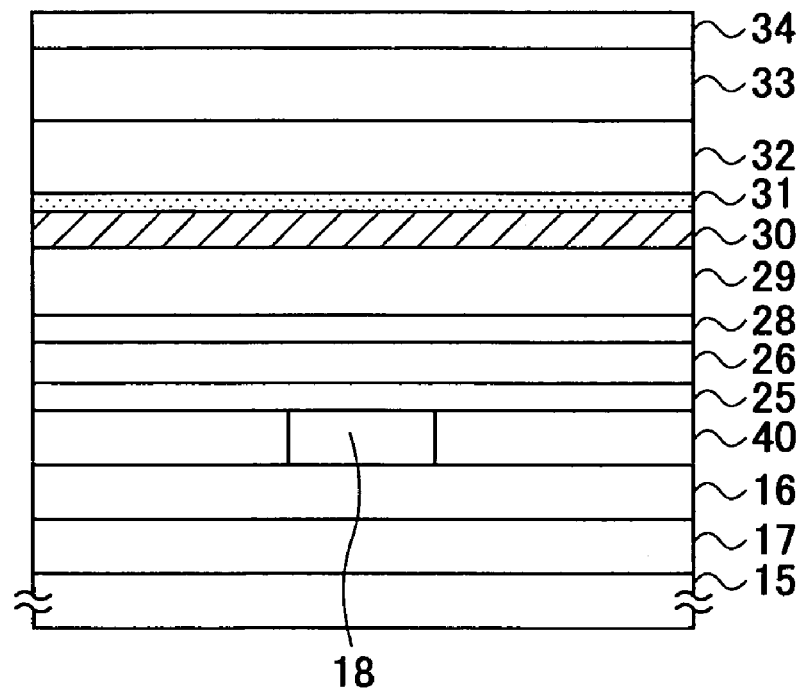

Next, in the process of FIG. 5B, after exhausting the oxygen gas in the oxidation chamber, the substrate is conveyed again to the deposition chamber without being exposed to air. In the deposition chamber, the non-magnetic intermediate layer through the protection layer 34, which are made of Cu, are formed by sputtering.

Further, in the process of FIG. 5B, heat treatment for converting the antiferromagnetic layer 26 into ordered alloy and causing antiferromagnetism to appear is performed. Specifically, a magnetic field is applied for 1.6 MA/m (20 kOe) in a predetermined direction, and a heating process is performed for 180 minutes at about 300° C.

Figure 6A:
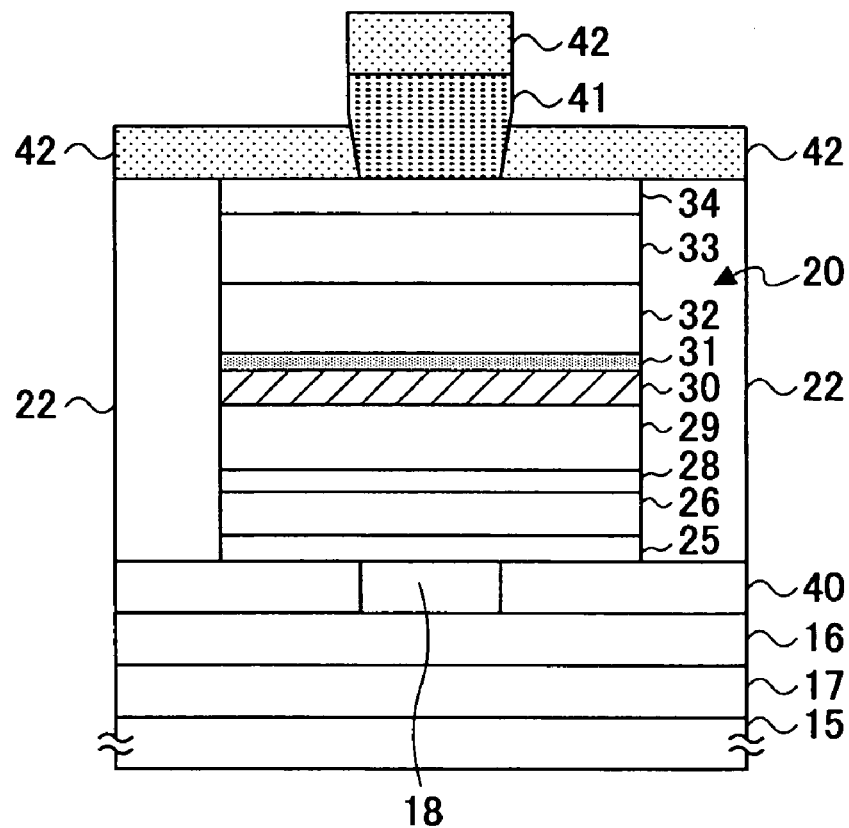
FIGS. 6A and 6B are diagrams showing manufacturing processes of the CPP magnetoresistive effect element according to the first embodiment of the present invention.

Next, in the process of FIG. 6A, the GMR film 20 formed by the processes up to FIG. 5B is etched and ground to be a desired width (corresponding to a read track width). Specifically, a resist is patterned and ground by dry etching until the alumina film 40 is reached.

Further, in the process of FIG. 6A, magnetic domain control films 22 are formed on the both sides of the GMR film 20. Specifically, a resist is patterned so as to provide openings at portions where the magnetic domain control films 22 are to be formed, and deposition is performed by, for example, sputtering. On this occasion, the magnetic domain control films 22 may be formed to contact the GMR film 20. However, it is preferable that insulating layers (e.g., the insulating film 23A shown in FIG. 2A, and the insulator 23B shown in FIG. 2B) such as alumina films are provided in the interfaces between the magnetic domain control films 22 and the GMR film 20.

Further, in the process of FIG. 6A, a resist 41 is patterned, and the resist 41 is left only in a portion that is directly above the GMR film 20 and forms the terminal portion 21-1 of the upper electrode 21. Then, an insulating film 42 covering the entire structure is formed. Specifically, a silicon oxide film or an alumina film is formed by, for example, sputtering or the CVD method.

Figure 6B:
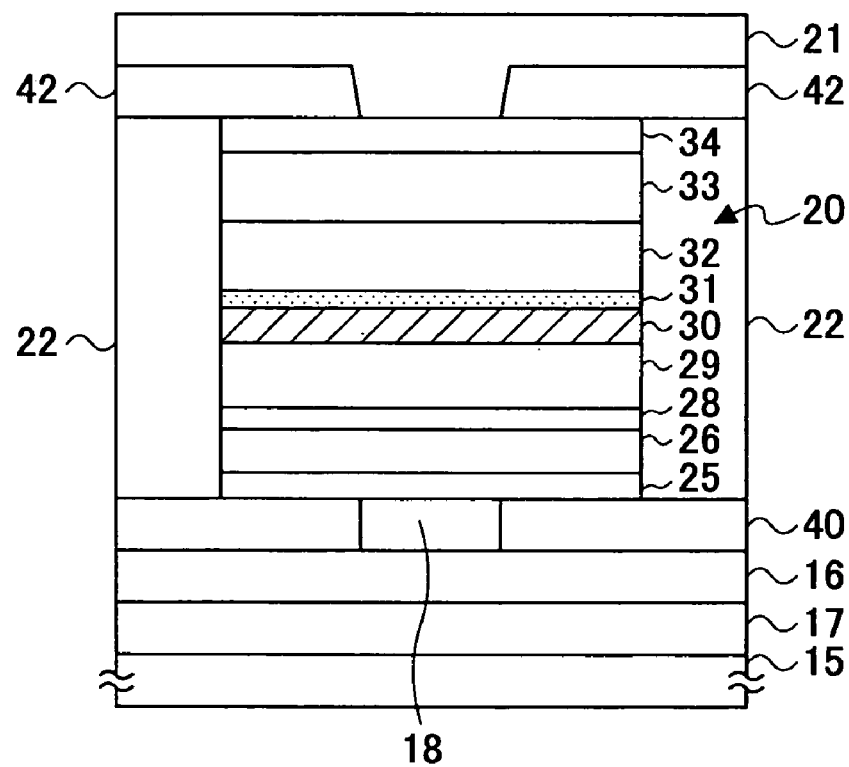

Next, in the process of FIG. 6B, after removing the insulating film 42 on the resist 41 together with the resist 41, the upper electrode 21 made of $Ni_{80}Fe_{20}$ is formed by, for example, sputtering. In the aforementioned manner, the CPP magnetoresistive effect-element is formed. It should be noted that the guiding type writing element 11 is formed on the structure of FIG. 6B by a known method.

Referring to FIGS. 4A through 6B, the description has been given of the manufacturing processes of the case where the lower sub-electrode 18 and the terminal portion 21-1 are formed. However, it should be noted that the above-mentioned manufacturing processes may be similarly applied to the case where the lower sub-electrode 18 and the terminal portion 21-1 are not formed. Additionally, a description has not been provided for processes of forming an insulating layer (e.g., the insulating layer 23A shown in FIG. 2A) or an insulator (e.g., the insulator 23B shown in FIG. 2B). However, such an insulating layer or an insulator may be formed by a known method.

Next, prior to evaluation of the GMR film 20 according to this embodiment, evaluation was performed of the thickness of the oxide insulating layer formed by oxidizing according to natural oxidation.

A sample for evaluating the oxide insulating layer was prepared by forming a $CO_{88}Fe_{10}B_2$ layer, having a thickness of 10 nm, on a glass substrate in the above-mentioned high-vacuum chamber, and oxidizing a surface of the $CO_{88}Fe_{10}B_2$ layer in the oxidation chamber according to natural oxidation by setting the substrate temperature to 20° C. and changing the pressure of an oxygen atmosphere and a time period for exposing to the oxygen atmosphere. Then, a protection layer for preventing oxidation, which layer is made of Ta, was formed in the high vacuum chamber. On this occasion, simultaneously, a sample not subjected to the oxidation process was manufactured. Saturation magnetization was measured by applying, to the sample, the maximum magnetic field of 632 kA/m (8 kOe) by a VSM (Vibrating Sample Magnetometer).

Figure 7:
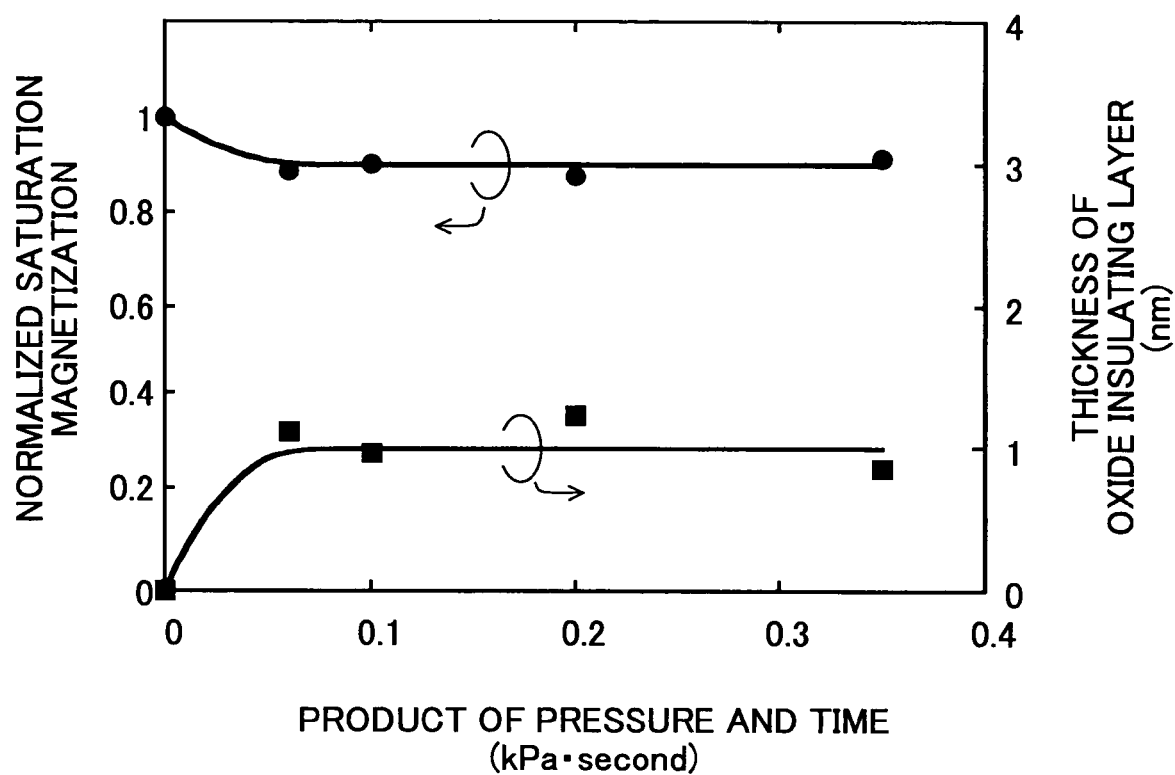
FIG. 7 is a graph showing the relationships among normalized saturation magnetization, the thickness of an oxide insulating layer, and the pressure time product.

FIG. 7 is a graph showing the relationships among normalized saturation magnetization, the thickness of an oxide insulating layer, and the product of the pressure of an oxygen gas and the time period of exposure to the oxygen gas. In FIG. 7, the horizontal axis represents the product (hereinafter referred to as "the pressure time product") of the pressure of the oxygen gas and the time period of exposure to the oxygen gas. The pressure time product corresponds to the number of collisions per unit area of oxygen molecules that collide with a surface of the $Co_{88}Fe_{10}B_2$ layer. Generally, it is considered that the higher the number of collisions, the more the thickness of the oxide insulating layer is increased. The vertical axis represents normalized saturation magnetization (=saturation magnetization of the sample subjected to the oxidation process/saturation magnetization of the sample not subjected to the oxidation process), which was normalized by using saturation magnetization of the sample not subjected to the oxidation process. The oxidized film thickness was obtained by the decreasing ratio of the normalized saturation magnetization, that is, the oxidized film thickness=the thickness of the $CO_{88}Fe_{10}B_2$ layer before the oxidation process×(1−normalized saturation magnetization).

Referring to FIG. 7, when the pressure time product is increased, the normalized saturation magnetization is decreased, that is, the oxidized film thickness is increased. Saturation was obtained at approximately 0.7 kPa·second, where the saturation magnetization is decreased by 10% from the initial value. Although the pressure time product was further increased, the saturation magnetization remained constant. In other words, the oxide insulating layer is formed to be 10% of the entire thickness of the $Co_{88}Fe_{10}B_2$ layer, i.e., 1.0 nm. Additionally, in the case where the oxidation process was performed by changing the pressure, relationships similar to those shown in FIG. 7 were obtained. That is, when the substrate temperature is 20° C., the oxide insulating layer formed by the oxidation process is 1.0 nm. Further, it is considered that, when the substrate temperature is increased, the thickness of the oxide insulating layer is increased. Additionally, when the Fe element ratio in the composition of the magnetic intermediate layer is increased, the thickness of the oxide insulating layer is increased.

Next, in order to evaluate the rate of resistance change of the GMR film according to this embodiment, GMR films having different thicknesses of the magnetic intermediate layer within the range of 0.3-2 nm and including: a Ta layer and an Au layer (lower electrode) having thicknesses of 10 nm and 40 nm, respectively; a Ta layer and a NiFe layer (base layer) having thicknesses of 5 nm and 2 nm, respectively; a PdPtMn layer (antiferromagnetic layer) having a thickness of 13 nm; a $Co_{88}Fe_{10}B_2$ layer having a thickness of 3 nm, a Ru layer having a thickness of 0.8 nm, and a $Co_{88}Fe_{10}B_2$ layer having a thickness of 4 nm (fixed magnetization layer); a Cu layer (lower non-magnetic intermediate layer) having a thickness of 2 nm; a $CO_{88}Fe_{10}B_2$ layer (magnetic intermediate layer); a CoFeBOx layer (oxide insulating layer); a Cu layer (upper non-magnetic intermediate layer) having a thickness of 2 nm; a $CO_{88}Fe_{10}B_2$ layer (free magnetization layer) having a thickness of 3 nm; a Cu layer having a thickness of 4 nm and a Ru layer having a thickness of 5 nm (protection layer); and an Au layer and a Ta layer (upper electrode) having thicknesses of 300 nm and 10 nm, respectively, are sequentially stacked on a wafer. The oxide insulating layers were formed by performing, on the surface of the magnetic intermediate layers, the oxidation process (exposure to an oxygen atmosphere having a pressure of 3.5 Pa for 100 seconds) according to natural oxidation.

The following method was used for measuring the rate of resistance change. In a state where the magnetization near the free magnetization layer of the fixed magnetization layers and the magnetization of the free magnetization layer are parallel, a current having a value with which value the voltage between the lower electrode and the upper electrode of the GMR film becomes 50 mV is applied, the intensity of an external magnetic field is set to −39.5 kA/m (−500 Oe) through 39.5 kA/m (500 Oe), and the voltage between the lower electrode and the upper electrode is detected, so as to measure a resistance value R. In addition, as for the rate of resistance change, the rate of resistance change (%)=($R_{max}$−$R_{min}$)/$R_{min}$×100, where the minimum value of the resistance value R is $R_{min}$, and the maximum value thereof is $R_{max}$. The RA value is the product of $R_{min}$ and an area A of the GMR film. The area A is 0.1-1 $\mu m^2$.

Figure 8:
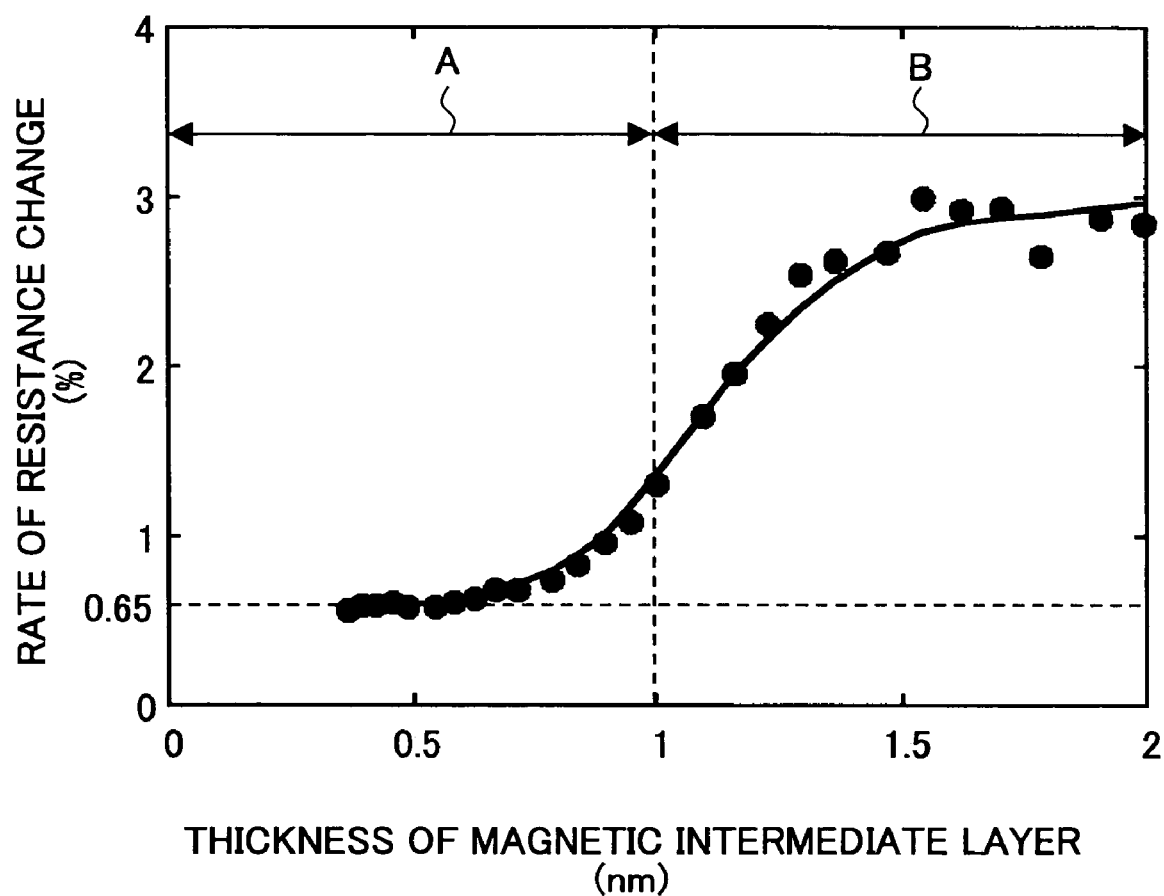
FIG. 8 is a graph showing the relationship between the rate of resistance change of a GMR film according to the first embodiment and the thickness of a magnetic intermediate layer.

FIG. 8 is a graph showing the relationship between the rate of resistance change of the GMR film of this embodiment and the thickness of the magnetic intermediate layer. Referring to FIG. 8, the rate of resistance change is increased with respect to-the thickness where the rate of resistance change is 0.6 nm or more, and is saturated in the vicinity of 1.5 nm. From the evaluation of the thickness of the oxide insulating layer according to the natural oxidation, when the thickness of the $Co_{88}Fe_{10}B_2$ layer of the magnetic intermediate layer is 1.0 nm or less (a range A shown in FIG. 8), the $CO_{88}Fe_{10}B_2$ layer is entirely oxidized and converted to an oxide of $CO_{88}Fe_{10}B_2$. Additionally, it is observed that, when the thickness of the $CO_{88}Fe_{10}B_2$ layer of the magnetic intermediate layer is 1.0 nm or more (a range B shown in FIG. 8), stacked layers of $CO_{88}Fe_{10}B_2$ and the oxide of $Co_{88}Fe_{10}B_2$ are formed.

Accordingly, an increase in the rate of resistance change when the thickness is 0.6-1.0 nm is caused by an effect brought by local concentration of a sense current by the oxide insulating layer, i.e., a current confining effect. On the other hand, when the thickness of the $Co_{88}Fe_{10}B_2$ layer of the magnetic intermediate layer is 1 nm or more, the increase is approximately 2.95%. This increase in the rate of resistance change is significantly higher than 1.35%, which is the maximum rate of resistance change in the case where the thickness is 1 nm or less. It is considered that this is brought about by a bulk scattering effect within the magnetic intermediate layer, and by a scattering effect in the magnetic intermediate layer and in the interface between the magnetic intermediate layer and the Cu layer thereunder, i.e., a magnetic/non-magnetic interface.

According to this embodiment, since the oxide insulating layer and the magnetic intermediate layer are provided between the fixed magnetization layer and the free magnetization layer, the rate of resistance change is significantly increased by the current confining effect to the sense current, leading to increase in the bulk scattering effect within the magnetic intermediate layer and the interface scattering effect of the magnetic/non-magnetic interface. Accordingly, it is possible to realize a sensitive CPP magnetoresistive effect element.

Next, a description is given of a variation of the first embodiment. The variation is similar to the first embodiment except that a further magnetic intermediate layer is formed on the oxide insulating layer.

Figure 9:
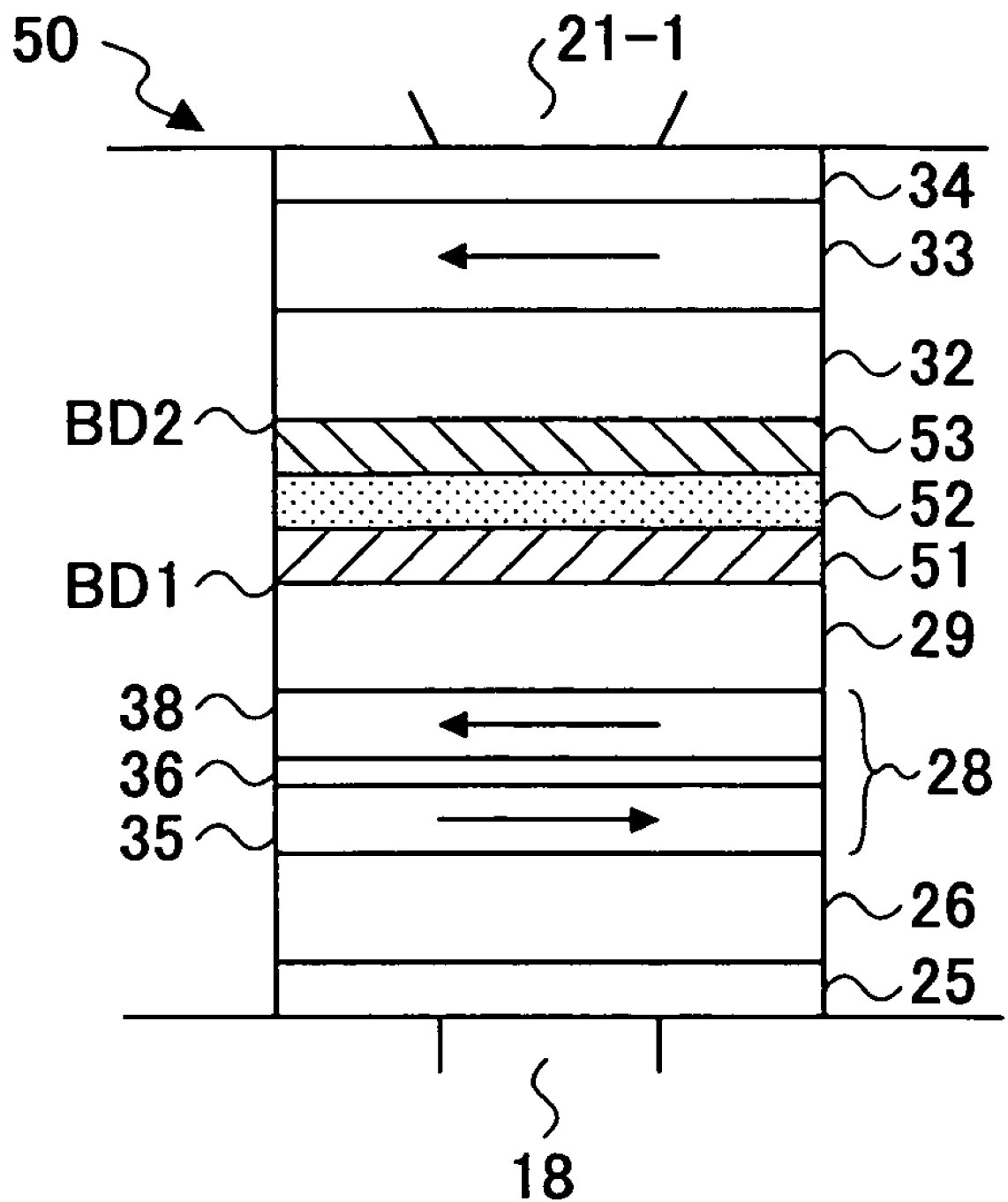
FIG. 9 is a diagram showing the structure of a GMR film according to a variation of the first embodiment.

FIG. 9 is a diagram showing the structure of a GMR film according to the variation. In FIG. 9, those parts that are corresponding to the above-mentioned parts are designated by the same reference numerals, and a description thereof is omitted.

Referring to FIG. 9, a GMR film 50 according to this variation includes a single spin-valve structure in which the base layer 25, the antiferromagnetic layer 26, the fixed magnetization layer 28, the lower non-magnetic intermediate layer 29, a first magnetic intermediate layer 51, an oxide layer 52, a second magnetic intermediate layer 53, the upper non-magnetic intermediate layer 32, the free magnetization layer 33, and the protection layer 34 are sequentially stacked.

The first magnetic intermediate layer 51 and the oxide layer 52 are made of the same materials and formed according to the same methods that are used in the magnetic intermediate layer 30 and the oxide layer 31 according to the first embodiment.

The second magnetic intermediate layer 53 is formed on the oxide layer 52 by, for example, sputtering, and the thickness thereof is 1-5 nm. The second magnetic intermediate layer 53 is made of the same materials as those of the first magnetic intermediate layer 51. By providing the second magnetic intermediate layer 53, in addition to the above-mentioned first magnetic/non-magnetic interface BD1, a second magnetic/non-magnetic interface BD2 is formed between the second magnetic intermediate layer 53 and the upper non-magnetic intermediate layer 32 formed thereon. Thus, with a scattering effect of the second interface BD2, it is possible to further improve the rate of resistance change.

Next, in order to evaluate the rate of resistance change of the GMR film 50 according to this variation, a GMR film was used that was similar to the GMR film used in the verification of the GMR film 10 according to the first embodiment, except for the first magnetic intermediate layer, the oxide layer, and the second magnetic intermediate layer 53. As for the first magnetic intermediate layer, a $Co_{88}Fe_{10}B_2$ layer having a thickness of 1.2 nm was formed. The oxide layer 52 was formed by an oxidation process under conditions similar to those in the first embodiment. Further, as for the second magnetic intermediate layer 53, $CO_{88}Fe_{10}B_2$ layers having different thicknesses within the range of 0.3-1.0 nm were formed.

Figure 10:
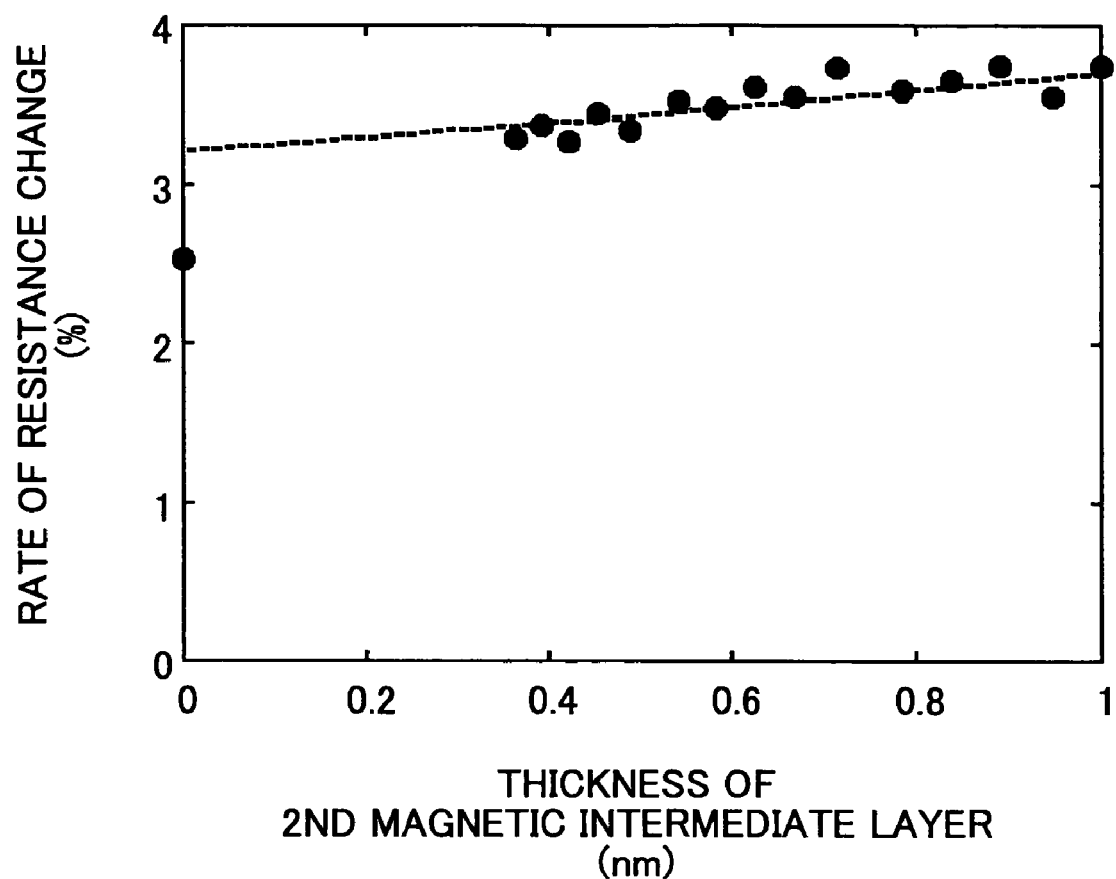
FIG. 10 is a graph showing the relationship between the rate of resistance change of a GMR film according to a variation of the first embodiment and the thickness of a second magnetic intermediate layer.

FIG. 10 is a graph showing the relationship between the rate of resistance change and the thickness of the second magnetic intermediate layer according to one embodiment of this variation. Referring to FIG. 10, it is observed that, compared to the case where the second magnetic intermediate layer is not provided (the thickness is 0 nm), the rate of resistance change is more increased in the case where the second magnetic intermediate layer is provided. Further, it is observed that the rate of resistance change is gradually increased, as the thickness of the second magnetic intermediate layer is further increased from 0.3 nm.

Here, if the rates of resistance change corresponding to the thicknesses in the range of 0.3-1.0 nm are extrapolated to the thickness of 0.0 nm, the rate of resistance change thereof is approximately 3.2%, which is higher by 0.7% than the rate of resistance change 2.5% in the case where the second magnetic intermediate layer is not provided. Thus, by providing the second magnetic intermediate layer, the second magnetic/non-magnetic interface is formed, and the rate of resistance change is increased by a scattering effect of the second interface.

Accordingly, with this variation, it is possible to further improve the rate of resistance change by providing the second magnetic intermediate layer.

Further, it is considered that the increase in the rate of resistance change when the thickness is between 0.3-1.0 nm is caused by bulk scattering of the second magnetic intermediate layer. That is, by increasing the thickness of the second magnetic intermediate layer, it is possible to further improve the rate of resistance change.

Second Embodiment

A second embodiment of the present invention is similar to the first embodiment except in that a layer made of an insulating material is provided instead of the oxide layer formed by oxidizing the magnetic intermediate layer.

Figure 11:
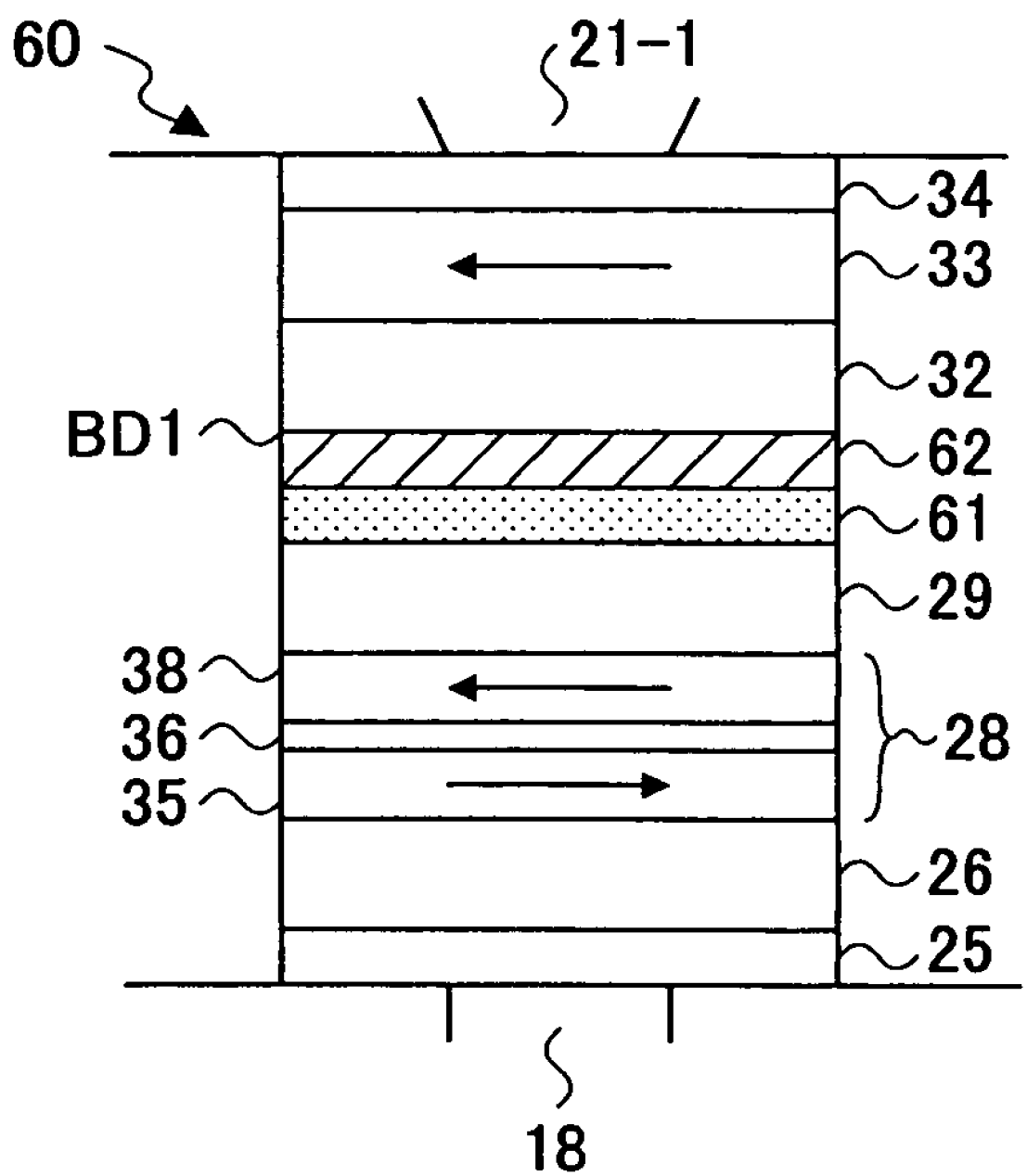
FIG. 11 is a diagram showing the structure of a GMR film according to a second embodiment of the present invention.

FIG. 11 is a diagram showing the structure of a GMR film according to this embodiment. In FIG. 11, those parts that are corresponding to the above-mentioned parts are designated by the same reference numerals, and a description thereof is omitted.

Referring to FIG. 11, a GMR film 60 according to this embodiment includes a single spin-valve structure in which the base layer 25, the antiferromagnetic layer 26, the fixed magnetization layer 28, the lower non-magnetic intermediate layer 29, an high resistive intermediate layer 61, a magnetic intermediate layer 62, the upper non-magnetic intermediate layer 32, the free magnetization layer 33, and the protection layer 34 are sequentially stacked.

The high resistive intermediate layer 61 is formed on the lower non-magnetic intermediate layer 29 by, for example, sputtering, and is made of a high resistive material having a thickness of 0.8 nm. Specifically, an oxide or nitride of a soft magnetic material, such as CoFeB, CoFe, NiFe and FeSiAl, may be used for the high resistive intermediate layer 61. These materials may be deposited by causing reaction in an oxygen or nitrogen atmosphere. The thickness of the high resistive intermediate layer 61 is set within a range of 0.3-2.0 nm. When the thickness is less than 0.3 µm, a current confining effect does not appear, while the resistance value of the GMR film becomes excessively high when the thickness is more than 2.0 nm, which is undesirable.

The magnetic intermediate layer 62 is formed on the high resistive intermediate layer 61 by, for example, sputtering. As for a material of the magnetic intermediate layer 62, a material similar to that of the magnetic intermediate layer 30 of the first embodiment may be used. The thickness of the magnetic intermediate layer 62 is selected within a range of 1-5 nm.

According to this embodiment, the rate of resistance change is improved since electrons are confined in the high resistive intermediate layer 61. Also, it is possible to improve the rate of resistance change by a scattering effect of the magnetic/non-magnetic interface BD1 formed between the magnetic intermediate layer 62 and the upper non-magnetic intermediate layer 32.

In this embodiment, the description is given of the case where the magnetic intermediate layer 62 is stacked on the high resistive intermediate layer 61. However, the high resistive intermediate layer 61 may be formed on the magnetic intermediate layer 62. Additionally, in each of the embodiments, a non-magnetic conductive layer may be provided between the magnetic intermediate layer 62 and the high resistive intermediate layer 61, and the magnetic intermediate layer 62 may be formed by stacking films each having a different material.

Third Embodiment

Figure 12:
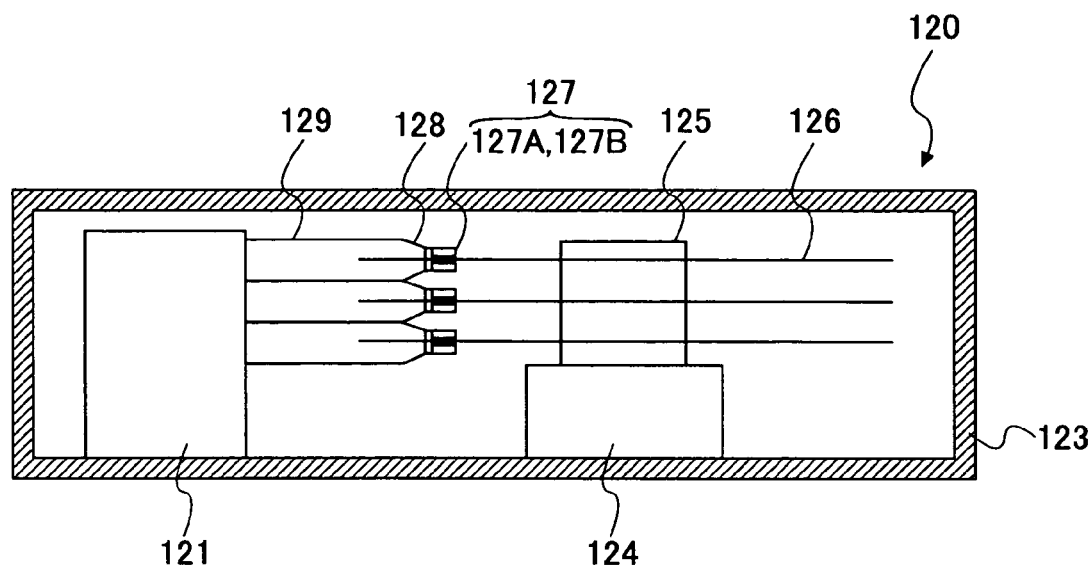
FIG. 12 is a cross-sectional view of a part of a magnetic storage device according to a third embodiment of the present invention.
Figure 13:
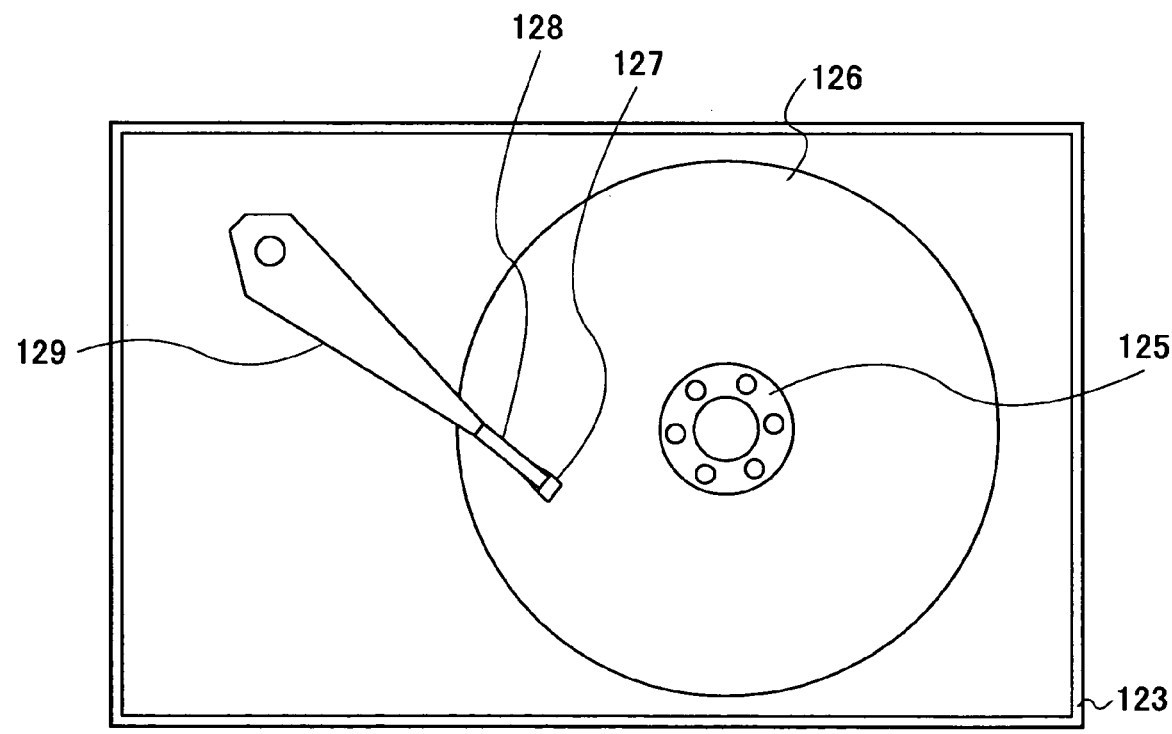
FIG. 13 is a plan view of the part of the magnetic storage device shown in FIG. 12.

Next, referring to FIGS. 12 and 13, a description is given of a magnetic storage device according to a third embodiment of the present invention. FIG. 12 is a cross-sectional view of a part of the magnetic storage device. FIG. 13 is a plan view of the part of the magnetic storage device shown in FIG. 12.

Referring to FIGS. 12 and 13, a magnetic storage device 120 generally includes a housing 123. A motor 124, a hub 125, plural magnetic recording media 126, plural compound type magnetic heads 127, plural suspensions 128, plural arms 129, and an actuator unit 121 are provided in the housing 123. The magnetic recording media 126 are mounted on the hub 125, which is rotated by the motor 124. The compound type magnetic heads 127 are each formed by a guiding type writing element 127A and a magnetoresistive effect element 127B (not shown since being minute). Each of the compound type magnetic heads 127 is attached to an end of a corresponding one of the arms 129 via a corresponding one of the suspensions 128. The arms 129 are driven by the actuator unit 121. Since the basic structure of the magnetic storage device is well known, a detailed description thereof is omitted in this specification.

The magnetic storage device 120 according to this embodiment is characterized by the magnetoresistive effect element 127B. The GMR film according to the first embodiment, the variation thereof, or the second embodiment may be used for the magnetoresistive effect element 127B. As mentioned above, such a GMR film has a high rate of resistance change, that is, high sensitivity for detecting a magnetic field. Thus, such a GMR film has a high reading ability and, even if a magnetic field emanating from a reversely magnetized region corresponding to 1 bit of information becomes minute, the GMR film can read the magnetic field. Thus, such a GMR film is preferable for high-density recording.

As will be appreciated from the above detailed descriptions, according to the present invention, it is possible to provide a CPP magnetoresistive effect element having a high rate of resistance change and high sensitivity, and being suitable for high-density recording; a manufacturing method thereof; and a magnetic storage device having such a CPP magnetoresistive effect element.

The present invention is not limited to the specifically disclosed embodiments, and variations and modifications may be made without departing from the scope of the present invention.

For example, in the above-mentioned embodiments, the descriptions are given of the cases where the fixed magnetization layer includes a stacked ferromagnetic structure. However, the free magnetization layer may include a stacked ferromagnetic structure. Further, both fixed magnetization layer and free magnetization layer may include a stacked ferromagnetic structure. Additionally, two fixed magnetization layers may be provided to form a dual spin-valve structure.

What is claimed is:

1. A CPP magnetoresistive effect element including a free magnetization layer, a fixed magnetization layer, and a plurality of conductive non-magnetic intermediate layers formed between the free magnetization layer and the fixed magnetization layer,
   wherein an insulating layer and a magnetic layer including magnetic atoms are provided between any two of the non-magnetic intermediate layers.

2. The CPP magnetoresistive effect element as claimed in claim 1, wherein a part of the insulating layer includes conductivity in a thickness direction thereof.

3. The CPP magnetoresistive effect element as claimed in claim 1, wherein the insulating layer and the magnetic layer contact each other.

4. The CPP magnetoresistive effect element as claimed in claim 3, wherein the insulating layer is made of an oxide of a material forming the magnetic layer.

5. The CPP magnetoresistive effect element as claimed in claim 4, wherein the total thickness of the insulating layer and the magnetic layer is within a range of 1-5 nm.

6. The CPP magnetoresistive effect element as claimed in claim 1, wherein the magnetic layer is formed by a plurality of layers, and the insulating layer is interposed between the magnetic layers.

7. The CPP magnetoresistive effect element as claimed in claim 1, wherein at least one of the free magnetization layer and the fixed magnetization layer includes a stacked ferromagnetic structure.

8. The CPP magnetoresistive effect element as claimed in claim 1, wherein the magnetic layer is a ferromagnetic layer.

9. The CPP magnetoresistive effect element as claimed in claim 1, wherein the magnetic atoms include at least one of Fe, Co and Ni.

10. The CPP magnetoresistive effect element as claimed in claim 9, wherein the magnetic layer is made of CoFe or CoFe alloy.

11. A magnetic storage device, comprising:
   a magnetic recording medium; and
   a CPP magnetoresistive effect element including a free magnetization layer, a fixed magnetization layer, and a plurality of conductive non-magnetic intermediate layers formed between the free magnetization layer and the fixed magnetization layer,
   wherein an insulating layer and a magnetic layer including magnetic atoms are provided between any two of the non-magnetic intermediate layers.

* * * * *